United States Patent [19]

Yamada et al.

[11] Patent Number: 5,694,680
[45] Date of Patent: Dec. 9, 1997

[54] APPARATUS AND METHOD FOR LAYING A WIRE

[75] Inventors: Takayuki Yamada; Hiroshi Rokutani; Nori Inoue, all of Yokkaichi, Japan

[73] Assignee: Sumitomo Wiring Systems, Ltd., Japan

[21] Appl. No.: 514,618

[22] Filed: Aug. 14, 1995

[30] Foreign Application Priority Data

Sep. 2, 1994 [JP] Japan .................................. 6-209761

[51] Int. Cl.$^6$ .................................................. H01K 3/10
[52] U.S. Cl. ............................ 29/850; 29/745; 140/92.1
[58] Field of Search ......................... 29/850, 745, 241; 140/92.1; 254/134.3 R

[56] References Cited

U.S. PATENT DOCUMENTS 4,684,765 8/1987 Beck et al. .
5,010,642 4/1991 Takashashi et al. ................. 29/745
5,412,861 5/1995 Fudoo et al. ........................ 29/850

FOREIGN PATENT DOCUMENTS 2 264 885  2/1993  United Kingdom .

Primary Examiner—P. W. Echols
Assistant Examiner—Adrian L. Coley
Attorney, Agent, or Firm—Anthony J. Casella; Gerald E. Hespos; Ludomir A. Budzyn

[57] ABSTRACT

To provide wire laying method and apparatus which realize high utilization of a wire laying space by pressing a plurality of wires one over another in a wire groove formed in an insulating plate, wires 2A to 2C drawn from a wire laying head 5 are, while being inserted into a wire groove 1a using a natural bend R, forcibly pressed to specified depths by a pressing pin 11 in synchronism with the movement of the wire laying head 5.

16 Claims, 5 Drawing Sheets

APPARATUS AND METHOD FOR LAYING A WIRE

BACKGROUND OF THE INVENTION

1. Field of the Invention

The present invention relates to an electrical connection box for automotive vehicles and is particularly designed to highly utilize a wire laying space by inserting a plurality of wires one over another into a wire groove formed in an insulating plate mounted in a casing of the electrical connection box.

2. Description of the Prior Art

Among the electrical connection boxes of this type, there is known one for easily responding to a design change of the internal circuits, in which box wires are arranged instead of the use of a busbar formed by punching a conductive metal plate, and the connection between the wires and external input/output terminals and the connection between the wires are established by the use of cramping terminals.

The above wires are laid as follows. After being laid in a wiring mold formed with a wire groove having the same pattern as a wiring pattern, the wires are transferred to a casing or an insulating plate on which cramping terminals are already mounted so that the wires are cramped by the cramping terminals at the same time when they are laid.

Instead of the method which employs the wiring mold, the present applicant previously proposed a method for laying wires directly along the wire groove formed in the insulating plate.

When using this prior art approach, a wire 2 is to be laid along a wire groove formed in a mold or a wire groove 1a formed in an insulating plate 1 as shown in FIG. 7(A), the wire 2 is laid into the groove 1a as shown in FIG. 7(B).

In accordance with the prior art method, and as shown in FIG. 5, the wire 2 is laid as follows. The wire 2 drawn from a path 3a of a wire laying head 3 which moves in one direction along the upper surface of the insulating plate 1 is laid while being arranged in the wire groove 1a using a natural bend R.

As seen in FIG. 7(B), it is difficult to arrange the wire 2 into the groove 1a at a corner portion 1c of the groove 1a using only the natural bend R. Thus, a recess 1d for allowing the wire 2 to bend is formed in the corner portion 1c. By bending the wire 2 in the recess 1d as shown in FIG. 7(C), the wire 2 can be arranged into the corner portion 1c as shown in FIG. 7(D).

However, since the prior art wire laying method is such that the wire 2 is arranged into the groove 1a using the natural bend R, the wire 2 cannot be deeply inserted into the groove 1a as shown in FIG. 6(A).

Accordingly, even if an attempt is made to insert another wire 2B over a previously inserted wire 2A in order to reduce a space taken up by the laid wires, the wire 2B is likely to come out of the groove 1a because the previous wire 2A is not sufficiently deeply inserted. Thus, a plurality of wires 2A and 2B cannot be securely laid one over another.

If another wire groove 1e for the wire 2B is formed inward of the groove 1a for the wire 2A, the wires 2A and 2B can be laid next to each other in the horizontal direction, as shown in FIG. 6B. However, this leaves a problem due to the larger wire laying space needed.

Thus, it is an object of the present invention to provide wire laying method and apparatus for deeply inserting a wire into a groove, in particular, for realizing a high utilization of a wire laying space, when a plurality of wires have to be arranged.

SUMMARY OF THE INVENTION

According to the subject invention, wire drawn from a wire laying head is inserted into a wire groove using a natural bend, and is forcibly pressed to a specified depth in the vicinity of the end of this bent portion by a pressing means.

Accordingly, the wire can be forcibly pressed to the specified depth even in the portions where it is difficult to press the wire only using the natural bend, particularly a corner portion and a linear portion having a narrow width. Further, since the wire extending substantially in the horizontal direction in the vicinity of the bent portion is pressed down by the pressing means, in particular by a pressing pin, the sheath of the wire will not be damaged by the friction between the wire and the pressing pin.

According to a preferred embodiment of the invention, the wire laying head is provided with pressing means, preferably with a pressing pin, which moves upward and downward in synchronism with the movement of the wire laying head. Thus, the height of the pressing pin can be easily controlled.

Preferably, the method for laying a wire in an electrical connection box is performed by pressingly inserting a wire drawn from a wire laying head into a wire groove formed in a wire laying member inclined to the wire groove while naturally bending the wire by its contact with the bottom surface of the wire groove, wherein the wire being inserted into the wire groove while being bent is inserted into the wire groove while being forcibly pressed down to a specified depth by a pressing pin movably mounted in the vertical direction on the wire laying head.

Preferably, when a plurality of wires are laid one over another in the wire groove, the height of the pressing pin is controlled in such a manner that the pressing pin is lowered to a predetermined position when the lower wire is laid, while being raised to another predetermined position when the upper wire is laid.

Accordingly, the height of the pressing pin is controlled to control the depth by which the wire is inserted into the wire groove. Thus, the wires can be laid in a highly compact manner by inserting the wires one over another in the wire groove.

Preferably, the wire laying member comprises an insulating plate mounted in a casing of the electrical connection box, and wherein the wire(s) is/are laid while being pressing into the wire groove formed at least in one surface of the insulating plate in conformity with a circuit pattern.

Accordingly, the wire is directly laid in the wire groove formed in the insulating plate. Thus, an operation process can be simplified compared to the prior art method according to which the wire is transferred to the insulating plate or casing after being laid in the wiring mold.

BRIEF DESCRIPTION OF THE DRAWINGS

These and other objects, features and advantages of the present invention will become more apparent upon a reading of the following detailed description and accompanying drawings in which.

DETAILED DESCRIPTION OF THE PREFERRED EMBODIMENT

Figure 1:
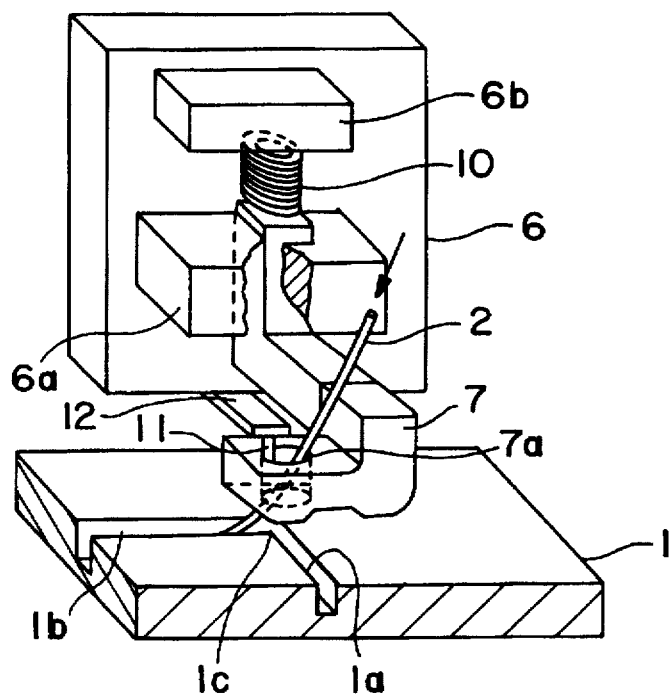
FIG. 1 is a perspective view of a main body of a wire laying head according to the invention.

Elements having the same construction and action as the prior art as shown in FIGS. 5 to 7(D) are identified by the same reference numerals and no detailed description is given thereto.

Figure 2:
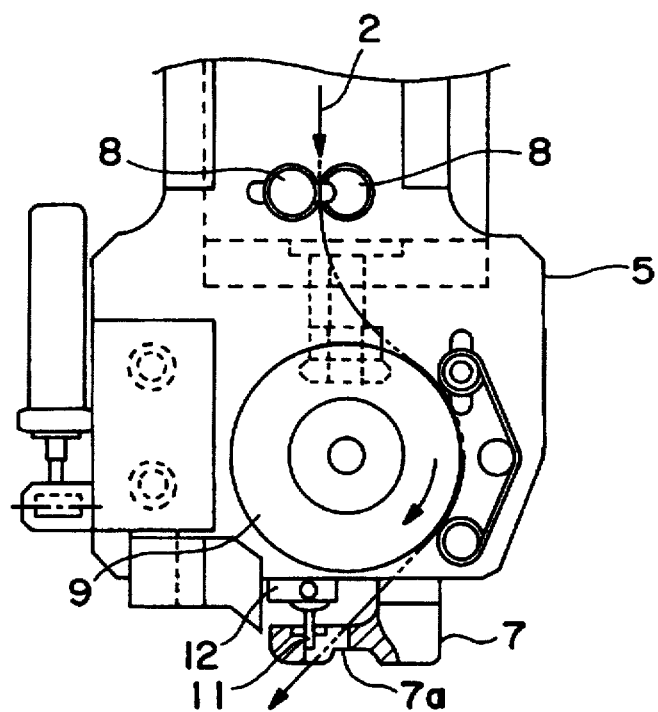
FIG. 2 is a front view of an essential portion of the wire laying head.

As shown in FIGS. 1 and 2, a head main body 6 is mounted at the lower part of a wire laying head 5 movably upward and downward. A wire retaining arm 7 facing the upper surface of an insulating plate 1 formed with a wire groove 1a is mounted on the main body 6 movably upward and downward.

The head 5 is provided with guide rollers 8, 8 and a feed roller 9 for guiding and feeding a wire 2, respectively. As indicated by arrows in FIG. 2, the wire 2 is drawn from the retaining arm 7 at a specified speed as the feed roller 9 rotates.

The head main body 6 is stroke-controlled such that it moves upward and downward relative to the head 5 at specified strokes.

The retaining arm 7 is movably guided in the vertical direction by a guide member 6a of the head main body 6, and is biased downward by a spring 10 mounted between a projection 6b of the head main body 6 and an upper end of the retaining arm 7.

While the wire 2 is laid, the lower edge or end of a wire drawing path 7a of the retaining arm 7 is constantly in contact with the upper surface of the insulating plate 1 due to the biasing force of the spring 10.

A pressing pin 11 is inserted at the rear side (downstream side) of the wire drawing path 7a of the retaining arm 7 which is wide in a wire laying direction. The pressing pin 11 is secured on a bracket 12 projecting from the head main body 6.

Figure 3A:
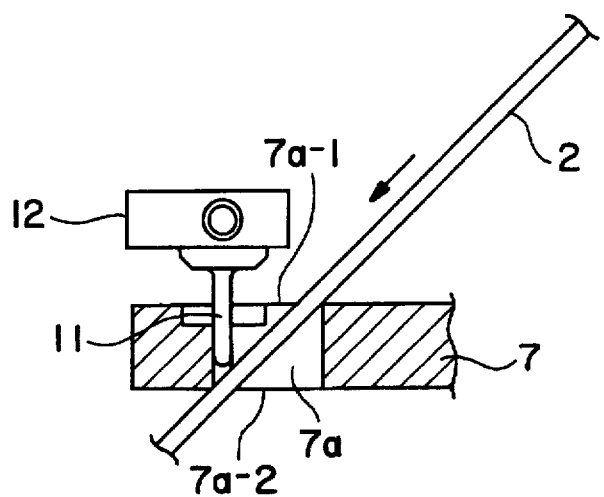
FIG. 3(A) is a side view in section showing the relationship between a pressing pin and a wire.

As shown in FIG. 3, wire 2 inserted from one lateral end of an inlet 7a-1 at the upper end of the path 7a comes out from the other lateral end of an outlet 7a-2 at the lower end of the path 7 so that the wire 2 is inserted into the groove 1a inclined at a specified angle to the groove 1a.

Since the retaining arm 7 is constantly in contact with the upper surface of the insulating plate 1 due to the biasing force of the spring 10 as described above, the pressing pin 11 secured on the head main body 6 via the bracket 12 moves downward in the wire drawing path 7a which is located in a fixed position. On the other hand, when the head main body 6 is moved upward, the pressing pin 11 moves upward in the wire drawing path 7a.

The wire 2 passing through the wire drawing path 7a is drawn inclined between the inlet 7a-1 and the outlet 7a-2, and is inserted into the groove 1a inclined to the groove 1a. The inserted wire 2 comes into contact with the bottom surface of the groove 1a, thereby producing a natural bend R.

The wire 2 is forcibly pressed down by the pressing pin 11 in the vicinity of an end of this natural bend R to be properly positioned.

Figure 3B:
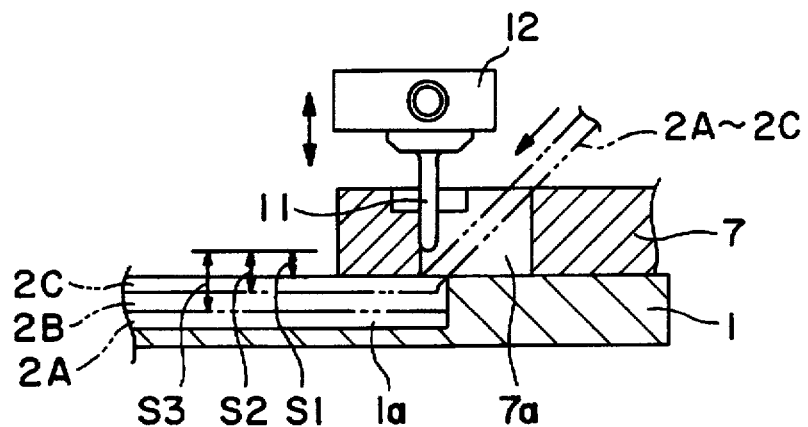
FIG. 3(B) is a side view in section showing how wires are pressed by the pressing pin.

The height of the pressing pin 11 is controlled by controlling the downward stroke of the head main body 6. For example, in the case where three wires 2A to 2C are pressed one over another into the groove 1a as shown in FIG. 3(B), the stroke of the head main body 6 is first set such that the pressing pin 11 has a stroke S3 for pressing the wire 2A to a bottommost position; secondly such that the pressing pin 11 has a stroke S2 for pressing the wire 2B to a middle position; and finally such that the pressing pin 11 has a stroke S3 for pressing the wire 2C to an uppermost position.

Figure 3C:
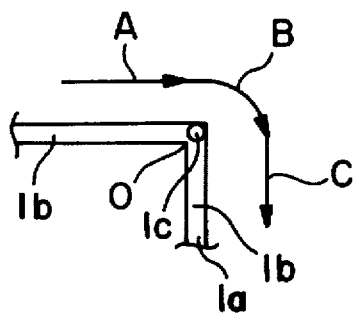
FIG. 3(C) is a plan view showing a wire groove and a moving direction of the wire laying head.

Further, when the head 5 undergoes a change of direction at a corner portion 1c of the groove 1a: from a moving direction A to a moving direction C which is at a right angle to the moving direction A as shown in FIG. 3(C), the pressing pin 11 is positioned at the corner portion 1c and the head 5 is rotated in a direction B about the pressing pin 11 as a center of rotation O.

Figure 4A:
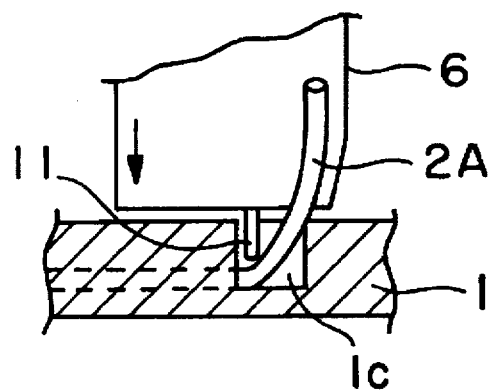
FIG. 4(A) is a side view in section showing how the wire is pressed.

In order to press the three wires 2A to 2C one over another in the groove 1a of the insulating plate 1 using the above constructed wire laying apparatus, the stroke of the pressing pin 11 is set to the stroke S1 corresponding to the uppermost position and the head 5 is moved in the direction A as shown in FIGS. 3(C) and 4(A) so that the wire 2A drawn from the retaining arm 7 is pressed into the groove 1a using the natural bend R.

Figure 4B:
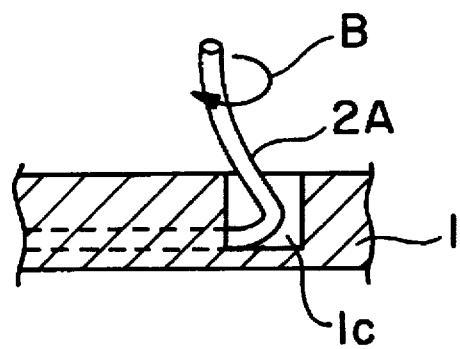
FIG. 4(B) is a side view in section how the wire is rotated at a corner portion.
Figure 4C:
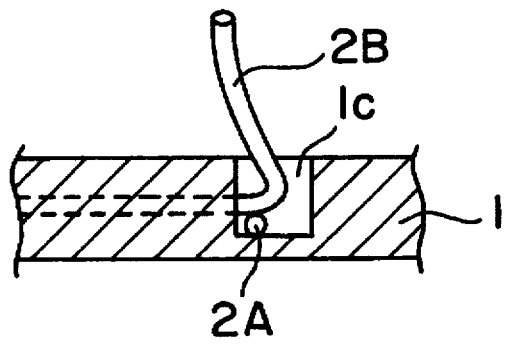
FIG. 4(C) is side view in section showing how a second wire is laid.
Figure 5:
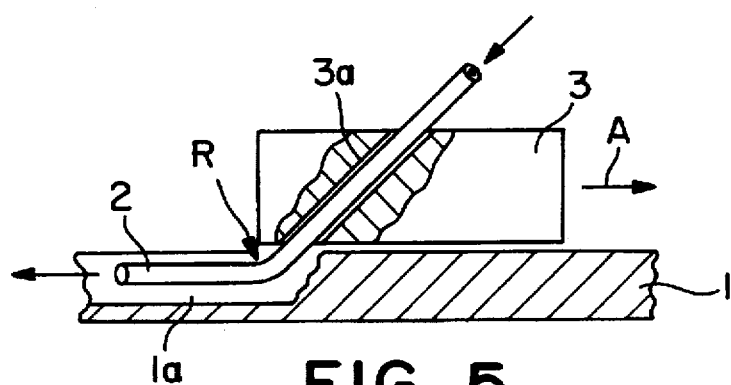
FIG. 5 is a side view partially in section of a prior art wire laying head.
Figure 6A:
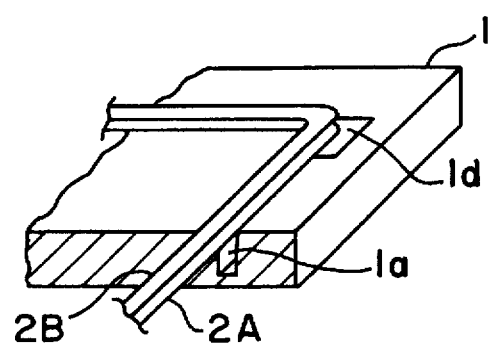
FIGS. 6(A) and 6(B) are perspective views of constructions for laying a plurality of wires in prior art wire grooves.
Figure 6B:
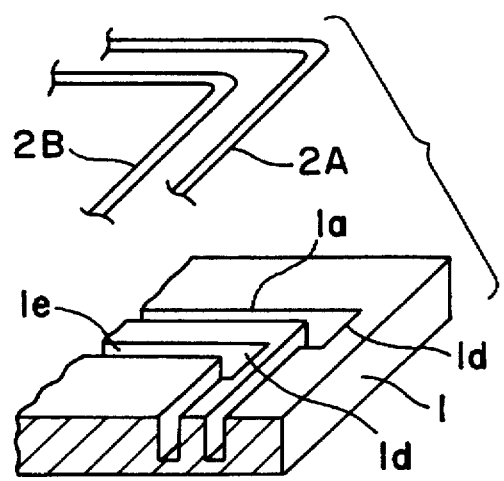
Figure 7A:
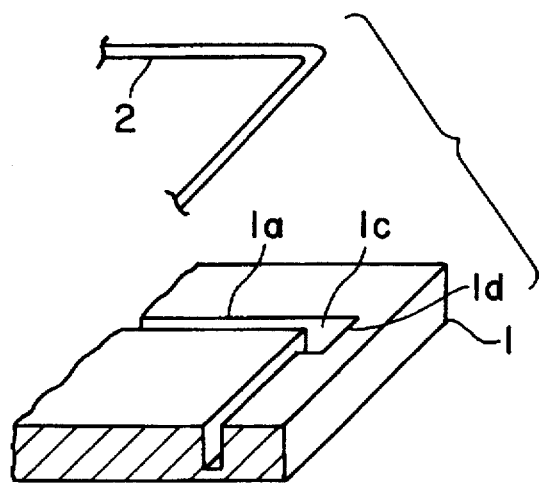
FIGS. 7(A) to 7(D) are a series of perspective views showing a prior art wire laying method.
Figure 7B:
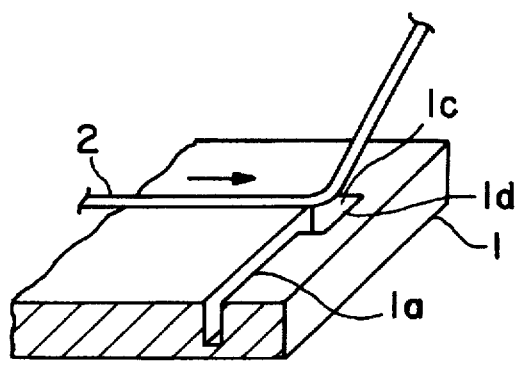
Figure 7C:
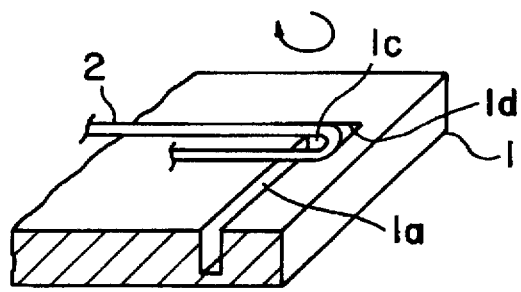
Figure 7D:
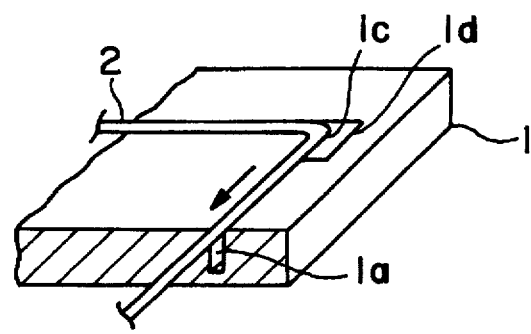

At the corner portion 1c, the head 5 is rotated in the direction B about the pressing pin 11 as the center of rotation O as shown in FIG. 4(B). In synchronism with the rotation of the head 5, the pressing pin 11 is lowered to have the stroke S3, and the head 5 is moved further in the direction C.

The portion of the wire 2A linearly laid in the direction A is pressed downward by the lowered pressing pin 11, which further presses the wire 2A to the bottommost position where the wire 2A is in contact with the bottom of the groove 1a so that the wire 2A drawn from the retaining arm 7 can be laid in the corner portion 1c and the linear portion 1b of the groove 1a extending in the direction C.

Similarly, when the wire 2B is to be laid, the head main body 6 is moved upward so that the pressing pin 11 has the stroke S1. In this state, the wire 2B drawn from the retaining arm 7 is pressed into the groove 1a using the natural bend R while the head 5 is moved in the direction A. At the corner portion 1c, the pressing pin 11 is lowered to have the stroke S2 in synchronism with the rotation of the head 5 in the direction B.

Accordingly, the portion of the wire 2B already laid in the direction A is pressed to the middle position, and the wire 2B is laid over the previously laid wire 2A in the bottommost position with the stroke S2 in the corner portion 1c and the linear portion 1b of the groove 1a extending in the direction C.

Finally, when the wire 2C is laid in the uppermost position, the head main body 6 is moved upward so that the pressing pin 11 has the stroke S1. In this state, the wire 2C drawn from the retaining arm 7 is inserted into the groove 1a using the natural bend R while the head 5 is moved in the direction A. The wire 2C is forcibly pressed to the uppermost position at the end of the bent portion by the pressing pin 11.

The wires corresponding to the bottommost, middle and uppermost positions are forcibly pressed to the specified depths in the groove 1a by the pressing pin 11 as described above. Accordingly, the wires 2A to 2C can be securely pressed to the specified depths even in the corner portion 1c and the narrow linear portions 1b where it is difficult to press the wires only using the natural bend R.

Since the respective wires 2A to 2C do not come out of the groove 1a, they can be laid one over another in the groove 1a, thereby highly utilizing the wire laying space.

Further, the wire is basically inserted into the groove using the natural bend, and the substantially horizontally extending wire is pressed downward by the pressing pin. Thus, problems such as a scraped sheath of the wire due to friction between the pressing pin 11 and the wire will not arise.

Although the three wires 2A to 2C are laid one over another in the foregoing embodiment, one, two, four or more wires may be laid one over another.

As is clear from the above description, the wire drawn from the wire laying head is inserted into the wire groove using the natural bend, and is forcibly pressed to a specified depth in the vicinity of the end of the bent portion by the pressing pin. The wire can be forcibly pressed to the specified depth even in the corner portion and the narrow linear portions where it is difficult to press the wires only using the natural bend.

Preferably, the wires are pressed to the specified depths by controlling the distance by which the wires are pressed. Accordingly, the upper-located wire(s) can be pressed into the wire groove in such a manner that they do not come out of the wire groove. Thus, a plurality of wires can be laid one over another, thereby highly utilizing the wire laying space.

Further, the wire laying head may be provided with the pressing pin which moves downward in synchronism with the movement of the wire laying head. Thus, the sheath of the wire will not be scraped due to the friction between the pressing pin and the wire being drawn, and the moving speed of the wire laying head is not slowed.

What is claimed is:

1. A method for laying at least one a wire (2,2A,2B,2C) into a wire groove (1a,1b,1c) formed in a surface of a wire receiving member (1), the wire groove comprising a plurality of straight portions (1a,1c) and at least one corner portion (1b) disposed between and connecting the straight portions (1a,1c), said wire groove (1a,1b,1c) having a bottom surface, said method comprising the following steps:

drawing the wire (2) from a wire laying head (5) that is aligned with the wire groove (1a,1b,1c) formed in the wire receiving member (1), such that the wire (2) is inclined to the surface of the wire receiving member (1) and such that the wire (2) is naturally bent by its contact with the bottom surface of the wire groove (1a,1b,1c), moving the wire laying head (5) along the wire receiving member (1) for laying the wire (2) in the wire groove, and forcibly pressing the wire (2) to a specified depth (S1,S2, S3) by a pressing member (11) when the wire laying head (5) is aligned with the corner portion (1b) of the wire groove.

2. A method according to claim 1, wherein the pressing member (11) is movably mounted on the wire laying head (5).

3. A method according to claim 1, wherein the pressing member (11) moves reciprocatingly towards and from the wire receiving member (1).

4. A method according to claim 1, wherein the pressing is applied by the pressing member (11) in a position near portions of the wire (2) bent by contact with the bottom surface of the wire groove.

5. A method according to claim 1, wherein the at least one wire comprises a plurality of wires (2A,2B,2C), including a lower (2A) and at least one upper wire (2B,2C), said wires (2A,2B,2C) being laid one over another in the wire groove (1a,1b,1c), the pressing member (11) being controlled in such a manner that the pressing member (11) is lowered to a predetermined lower position (S3) when the lower wire (2A) is laid, and such that the pressing means is lowered to at least one predetermined upper position (S1;S2) when one of the upper wires (2B;2C) is laid.

6. A method according to claim 1, wherein, the wire laying head (5) is rotated when the wire (2) is laid around a corner portion (1c) of the groove, the pressing member (11) being lowered while the wire laying head (5) is rotated.

7. An apparatus for inserting a wire (2,2A,2B,2C) into a wire groove (1a,1b,1c) formed in a surface of a wire receiving member (1), said apparatus comprising:

a wire laying head (5) for feeding the wire (2,2A,2B,2C) into the wire groove (1a,1b,1c) which is formed in the surface of the wire receiving member (1), such that the wire (2,2A,2B,2C) is fed at an angle with respect to the surface formed with the wire groove (1a,1b,1c), said wire laying head (5) being movable relative to said wire receiving member (1) for following said wire groove (1a,1b,1c), and a blunt-ended pressing means (11) selectively movable toward the wire groove (1a,1b,1c) for forcibly pressing the wire (2,2A,2B,2C) into selected portions of the wire groove (1a,1b,1c).

8. An apparatus according to claim 7, wherein the wire laying head (5) comprises a wire drawing path (7a) having such a shape as to allow the pressing means (11) to press the wire (2) into the groove (1a,1b,1c) without exerting a large bending force on it.

9. An apparatus according to claim 8, wherein the pressing means (11) is partly arranged in the wire drawing path (7a).

10. An apparatus according to claim 8, wherein the drawing path is formed in the wire laying head (5) as a through hole (7a), wherein its cross-section is essentially larger than the diameter of the wire (2) so that the wire (2) is allowed to be fed at an angle with respect to the axis of the through hole (7a).

11. An apparatus according to claim 10, wherein the wire drawing path (7a) is formed in a retaining arm (7) movably mounted on the wire laying head (5).

12. An apparatus according to claim 11, wherein the retaining arm (7) is kept in contact with the surface of the wire receiving member (1) by a biasing means (10).

13. An apparatus according to claim 12, wherein the wire receiving member comprises an insulating plate (1) mounted in a casing of an electrical connection box, and wherein the wire groove (1a,1b,1c) is formed in at least one surface of the insulating plate (1) in conformity with a circuit pattern.

14. An apparatus according to claim 13, wherein the wire groove (1a,1b,1c) includes a bottom surface, the wire being bent at portions between the bottom surface of the wire groove (1a,1b,1c) and the wire laying head (5), the pressing means (11) being disposed for forcibly pressing the wire (2) downward in a position near the bend (R) of the wire (2).

15. An apparatus according to claim 7, wherein the wire groove comprises a plurality of straight portions (1a,1c) and at least one corner portion (1b) between the straight portions (1a,1c), the wire head being rotatable at said corner portion (1b) for following from one said straight portion (1a) to another of said straight portions (1c), said pressing means (11) being selectively movable substantially when said wire laying head (5) rotates for forcibly pressing the wire (2) into the corner portion (1b) of the wire groove.

16. An apparatus according to claim 7, wherein the wire laying head (5) is operable for sequentially feeding a plurality of wires (2A,2B,2C) into the wire groove (1a,1b,1c) one over another, the pressing means (11) being selectively movable to one of a plurality of predetermined positions (S1,S2,S3) in accordance with the relative position of the respective wire (2A,2B,2C).

* * * * *